United States Patent
Suzuki et al.

(10) Patent No.: US 8,040,724 B2
(45) Date of Patent: Oct. 18, 2011

(54) MAGNETIC DOMAIN WALL RANDOM ACCESS MEMORY

(75) Inventors: Tetsuhiro Suzuki, Tokyo (JP); Norikazu Ohshima, Tokyo (JP); Shunsuke Fukami, Tokyo (JP); Kiyokazu Nagahara, Tokyo (JP); Nobuyuki Ishiwata, Tokyo (JP)

(73) Assignee: NEC Corporation, Tokyo (JP)

( * ) Notice: Subject to any disclaimer, the term of this patent is extended or adjusted under 35 U.S.C. 154(b) by 68 days.

(21) Appl. No.: 12/671,012

(22) PCT Filed: Jul. 7, 2008

(86) PCT No.: PCT/JP2008/062277
§ 371 (c)(1),
(2), (4) Date: Feb. 24, 2010

(87) PCT Pub. No.: WO2009/019947
PCT Pub. Date: Feb. 12, 2009

(65) Prior Publication Data
US 2010/0193890 A1    Aug. 5, 2010

(30) Foreign Application Priority Data
Aug. 3, 2007    (JP) ................ 2007-202943

(51) Int. Cl.
*G11C 11/15*    (2006.01)
(52) U.S. Cl. ......... 365/173; 365/48; 365/49.13; 365/55; 365/145; 365/157
(58) Field of Classification Search .......... 365/173, 365/48, 49.13, 117, 145, 157
See application file for complete search history.

(56) References Cited

U.S. PATENT DOCUMENTS

| | | | |
|---|---|---|---|
| 5,640,343 A | | 6/1997 | Gallagher et al. |
| 6,055,179 A | * | 4/2000 | Koganei et al. ........... 365/158 |
| 6,545,906 B1 | | 4/2003 | Savtchenko et al. |
| 6,834,005 B1 | | 12/2004 | Parkin |

FOREIGN PATENT DOCUMENTS

| | | |
|---|---|---|
| JP | 2001257395 A | 9/2001 |
| JP | 2003045010 A | 2/2003 |
| JP | 2003110094 A | 4/2003 |

(Continued)

OTHER PUBLICATIONS

N. Sakimura et al., "MRAM Cell Technology for Over 500MHz SoC", 2006 Symposium on VLSI Circuits, Digest of Technical Papers, pp. 136-137.

(Continued)

*Primary Examiner* — Thong Q Le (57) ABSTRACT

A magnetic random access memory includes: a magnetic recording layer including a ferromagnetic layer and having perpendicular magnetic anisotropy; and a magnetic reading layer provided on the magnetic recording layer and used for reading information. The magnetic recording layer includes: a magnetization switching area having reversible magnetization; a first magnetization pinned area connected to a first boundary of the magnetization switching area and having magnetization whose direction is pinned in a first direction; and a second magnetization pinned area connected to a second boundary of the magnetization switching area and having magnetization whose direction is pinned in a second direction. The magnetic reading layer includes: a magnetic sensing layer whose direction of magnetization changes based on a direction of the magnetization of the magnetization switching area; a nonmagnetic barrier layer provided on the magnetic sensing layer; and a pinned layer provided on the nonmagnetic barrier layer.

15 Claims, 10 Drawing Sheets

FOREIGN PATENT DOCUMENTS

| | | | |
|---|---|---|---|
| JP | 2004179183 A | 6/2004 |
| JP | 2005505889 A | 2/2005 |
| JP | 2005093488 A | 4/2005 |
| JP | 2005123617 A | 5/2005 |
| JP | 2005150303 A | 6/2005 |
| JP | 2005191032 A | 7/2005 |
| JP | 2005236250 A | 9/2005 |
| JP | 2006073930 A | 3/2006 |
| JP | 2006093578 A | 4/2006 |
| JP | 2006270069 A | 10/2006 |
| JP | 2006287081 A | 10/2006 |
| JP | 2007103663 A | 4/2007 |
| JP | 20070258460 A | 10/2007 |
| JP | 2007317895 A | 12/2007 |
| WO | 2005069368 A | 7/2005 |
| WO | 2006046591 A | 5/2006 |
| WO | 2007020823 A | 2/2007 |

OTHER PUBLICATIONS

A. Thiaville et al., "Micromagnetic understanding of current-driven domain wall motion in patterned nanowires", Europhysics Letters, vol. 69 (6), 2005, pp. 990-996.

S. Imada et al., "Perpendicular magnetization of L10-ordered FePt films in the thinnest limit", Applied Physics Letters 90, 2007, pp. 132507-1-3.

C. Platt et al., "Structural and magnetic properties of CoCrPt perpendicular media grown on different buffer layers", Journal of Magnetism and Magnetic Materials, 247, 2002, pp. 153-158.

International Search Report for PCT/JP2008/062277 mailed Oct. 7, 2008.

J.C. Slonczewski, "Current-driven excitation of magnetic multilayers", Journal of Magnetism & Magnetic Materials, 159, L1-L7, 1996.

A. Yamaguchi et al., "Real-Space Observation of Current-Driven Domain Wall Motion in Submicron Magnetic Wires", Physical Review Letters, vol. 92, No. 7, Feb. 20, 2004, pp. 077205-1-4.

A. Yamaguchi et al., "Reduction of Threshold Current Density for Current-Driven Domain Wall Motion using Shape Control", Japanese Journal of Applied Physics, vol. 45, No. 5A, 2006, pp. 3850-3853.

H. Numata et al., "Magnetic Configuration of a New Memory Cell Utilizing Domain Wall Motion", Intermag 2006 Digest, HQ-03, 2006, p. 933.

D. Ravelosona et al., "Threshold currents to move domain walls in films with perpendicular anisotropy", Applied Physics Letters, vol. 90, 072508, 2007.

D.D. Djayaprawira et al., "230% room-temperature magnetoresistance in CoFeB/MgO/CoFeB magnetic tunnel junctions", Applied Physics Letters, vol. 86, 092502, 2005.

* cited by examiner

MAGNETIC DOMAIN WALL RANDOM ACCESS MEMORY

TECHNICAL FIELD

The present invention relates to a Magnetic Random Access Memory (MRAM), and especially relates to a domain wall motion MRAM.

BACKGROUND ART

In view of high integration and high speed operation, an MRAM is a promising nonvolatile memory. In the MRAM, a magnetoresistive element showing a "magnetoresistance effect" such as the TMR (Tunnel MagnetoResistance) effect is used. In the magnetoresistive element, a Magnetic Tunnel Junction (MTJ) where, for example, a tunnel barrier layer is sandwiched by two ferromagnetic layers is formed. The two ferromagnetic layers include: a magnetization pinned layer (a pinned layer) whose direction of the magnetization is pinned; and a magnetization free layer (a free layer) whose direction of the magnetization can be switched.

It has been known that a resistance value (R+ΔR) of the MTJ of a case where the directions of magnetization of the pinned layer and the free layer are "antiparallel" becomes larger than a resistance value (R) of a case where the directions are "parallel" due to the magnetoresistance effect. The MRAM uses a magnetoresistive element having the MTJ as a memory cell, and stores data in a nonvolatile manner by using variation of the resistance value. For example, the antiparallel state is related to data "1", and the parallel state is related to data "0". Writing of data to a memory cell is carried out by switching the direction of magnetization of the free layer.

As a method for writing data to the MRAM, the "asteroid method" and the "toggle method" have been known. According to these writing methods, switching magnetization required to switch the magnetization of the free layer becomes large approximately in inverse proportion to a memory cell size. That is, the more the memory cell is refined, the more a writing current tends to increase.

As a writing method able to suppress the increase of the writing current caused by the refinement, a "spin transfer method" is proposed (for example, refer to Japanese Patent Publication No. 2005-93488A1 (corresponding U.S. Pat. No. 7,193,284 (B2)), and "Current-driven excitation of magnetic multilayers", J. C. Slonczewski, Journal of Magnetism & Magnetic Materials, 159, L1-L7 (1996)). According to the spin transfer method, a spin-polarized current is injected to a ferromagnetic conductor, and the magnetization is switched due to a direct interaction between the spin of conduction electrons constituting the current and the magnetic moment (hereinafter referred to as the "Spin Transfer Magnetization Switching").

U.S. Pat. No. 6,839,005 discloses a magnetic shift register using the spin transfer. The magnetic shift register stores information by using a domain wall in the magnetic substance. In the magnetic substance divided into a plurality of areas (magnetic domains), an electric current is supplied so as to pass through the domain wall and the domain wall is moved by the electric current. The direction of magnetization in each area is treated as recording data. Such magnetic shift register is, for example, used for recording a large amount of serial data. Meanwhile, the motion of the domain wall in the magnetic substance is reported also in "Real-Space Observation of Current-Driven Domain Wall Motion in Submicron Magnetic Wires", A. Yamaguchi et al., Physical Review Letters, Vol. 92, pp. 077205-1-4 (2004).

The "domain wall motion MRAM" using the Domain Wall Motion caused by such spin transfer is described in Japanese Patent Publication No. 2005-191032A1 and in "Reduction of Threshold Current Density for Current-Driven Domain Wall Motion using Shape Control", A. Yamaguchi et al., Japanese Journal of Applied Physics, vol. 45, No. 5A, pp. 3850-3853 (2006).

Figure 1:
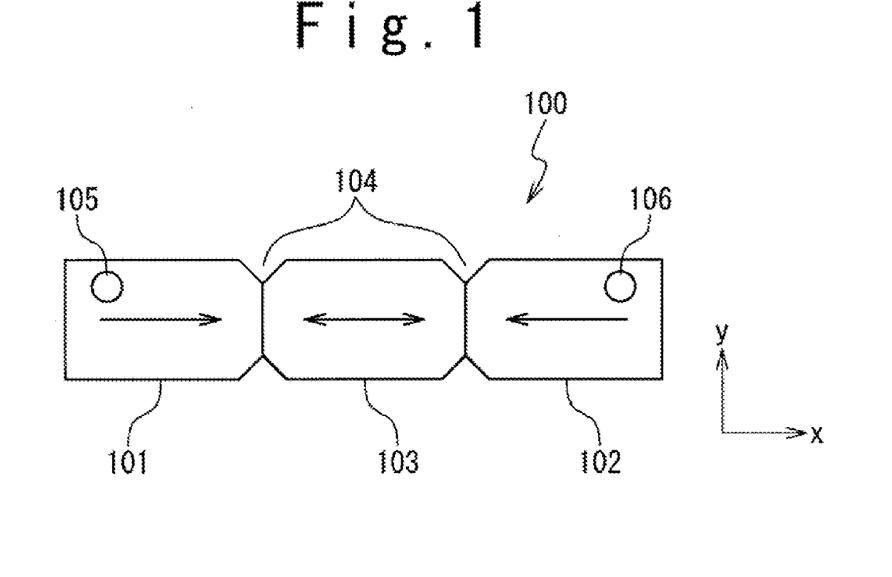
FIG. 1 is a schematic plane view showing a structure of a magnetization recording layer of Japanese Patent Publication No. 2005-191032A1.

An MRAM described in Japanese Patent Publication No. 2005-191032A1 includes: a magnetization pinned layer where magnetization is pinned, a tunnel insulating layer stacked on the magnetization pinned layer; and a magnetization recording layer stacked on the tunnel insulating layer. Since including a portion whose direction of the magnetization can be switched and a portion whose direction of the magnetization is not changed substantially, the magnetization recording layer is referred to as not a magnetization free layer but the magnetization recording layer. FIG. 1 is a schematic plane view showing a structure of the magnetization recording layer of Japanese Patent Publication No. 2005-191032A1. In FIG. 1, a magnetization recording layer 100 has a linear shape. The magnetization recording layer 100 includes: a joint portion 103 overlapping with a tunnel insulating layer and a magnetization pinned layer; constriction portions 104 adjacent to both ends of the joint portion 103; and a pair of magnetization pinned areas 101 and 102 formed to be adjacent to the constriction portions 104. The pinned magnetizations opposite each other are applied to the magnetization pinned areas 101 and 102, respectively. Moreover, the MRAM includes a pair of writing terminals 105 and 106 electrically connected to the pair of the magnetization pinned areas 101 and 102. Due to the writing terminals 105 and 106, an electric current penetrating through the joint portion 103, the pair of the constriction portions 104, and the pair of the magnetization pinned areas 101 and 102 of the magnetization recording layer 100 flows.

Figure 2:
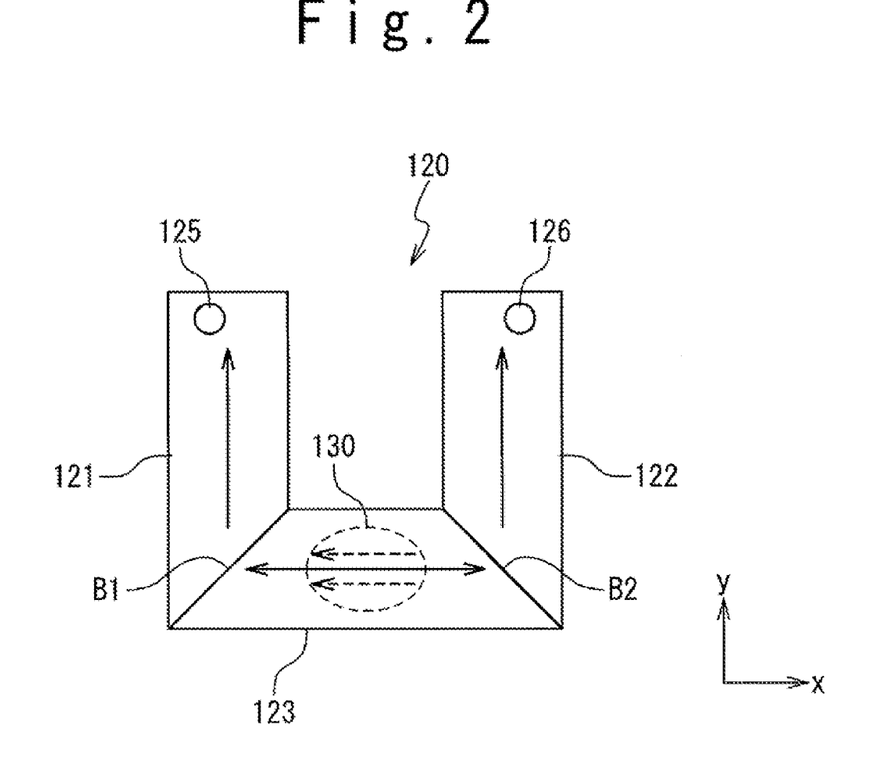
FIG. 2 shows a structure of a magnetic recording layer of a magnetic memory cell described in Intermag 2006 Digest, HQ-03 (2006)

FIG. 2 shows a structure of a magnetic recording layer 120 of a magnetic memory cell, which is described in "Magnetic Configuration of a New memory Cell Utilizing Domain Wall Motion", H. Numata et al., Intermag 2006 Digest, HQ-03 (2006). The magnetic recording layer 120 is U-shaped. Specifically, the magnetic recording layer 120 includes a first magnetization pinned area 121, a second magnetization pinned area 122, and a magnetization switching area 123. The magnetization switching area 123 overlaps with the pinned layer 130. The magnetization pinned areas 121 and 122 are formed to be extended in a Y direction, and their directions of magnetization are pinned in the same direction. Meanwhile, the magnetization switching area 123 is formed to be extended in an X direction, and has reversible magnetization. Accordingly, a domain wall is formed on a boundary B1 between the first magnetization pinned area 121 and the magnetization switching area 123 or on a boundary B2 between a second magnetization pinned area 122 and the magnetization switching area 123. Initialization of a magnetization state is carried out by applying a sufficiently-large initial magnetic field in a diagonal direction of 45 degree in an XY plane, and a state where: the magnetization of the magnetization pinned area is directed to a +Y direction; the magnetization of the magnetization switching area is directed to a +X direction; and the domain wall is formed on the boundary B1 is realized after the initial magnetic field is removed.

The magnetization pinned areas 121 and 122 are connected to respective current supply terminals 125 and 126. A writing current can flow in the magnetic recording layer 120 by using the current supply terminals 125 and 126. Depending on the direction of the writing current, the domain wall is moved in the magnetization switching area 123. The magnetization direction of the magnetization switching area 123 can be controlled by the domain wall motion.

However, in the MRAM using the current driven domain wall motion, it is concerned that an absolute value of the writing current becomes relatively large. Other than the above-mentioned Physical Review Letters, Vol. 92, pp. 077205-1-4 (2004), many reports about observation of the current driven domain wall motion are issued. Meanwhile, the domain wall motion requires a threshold current density of approximately $1 \times 10^8$ A/cm$^2$. In this case, for example, in a case where a width of layer causing the domain wall motion is 100 nm and the film thickness is 10 nm, the writing current is 1 mA. To reduce the writing current to be less than this value, it may be considered that the film thickness should be reduced. However, in this case, it is known that the current density required for the writing is further increased (for example, refer to the above-mentioned "Japanese Journal of Applied Physics, vol. 45, No. 5A, pp. 3850-3853 (2006)"). In the MRAM using the current driven domain wall motion, a technique able to reduce the writing current is desired.

Meanwhile, in an element using a perpendicular magnetic anisotropy material whose magnetic anisotropy of a magnetization recording layer is perpendicular to a substrate surface, a threshold current density of around $10^6$ A/cm$^2$ was observed (for example, refer to "Threshold currents to move domain walls in films with perpendicular anisotropy", D. Ravelosona et al., Applied Physics Letters, Vol. 90, 072508 (2007)).

Relating to the element using the perpendicular magnetic anisotropy material, Japanese Patent Publication No. 2003-110094A1 (corresponding U.S. Pat. No. 6,844,605 (B2)) discloses a magnetic memory using a perpendicular magnetization film and a manufacturing method thereof. The magnetic memory includes: a magnetoresistive element constituted by stacking a first magnetic layer including a perpendicular magnetization film, a nonmagnetic layer and a second magnetic layer including a perpendicular magnetization film, a switching magnetic field of the second magnetic layer being smaller than that of the first magnetic layer, a resistance value of a case where an electric current flows between the first magnetic layer and the second magnetic layer varying depending on a relative angle defined by a magnetization direction of the first magnetization layer and that of the second magnetization layer; and a magnetic field generation mechanism provided to switch the magnetization direction of the first magnetization layer of the magnetic resistance element. The magnetic memory is characterized in that the switching magnetic field Hc of the first magnetic layer expressed in the following expression (1) is set so as to be smaller than the magnetic field generated from the magnetic field generation mechanism.

$$Hc=2(Ku-2\pi Ms^2 f)/Ms \quad (1)$$

Here, Ku and Ms are the perpendicular magnetic anisotropy constant and the saturated magnetization of the first magnetic layer 11, respectively. When the film thickness and width of the first magnetic layer 11 are T and W, respectively, f is expressed in $f=7\times10^{-13}(T/W)^4-2\times10^{-9}(T/W)^3+3\times10^{-6}(T/W)^2-0.0019(T/W)+0.9681$.

In addition, Japanese Patent Publication No. 2006-73930A1 discloses a method of changing magnetization state of a magnetoresistance effect element using domain wall motion, and a magnetic memory element and a solid magnetic memory using the method. The magnetic memory element includes a first magnetic layer, an intermediate layer, and a second magnetic layer, and information is recorded on the basis of magnetization directions of the first magnetic layer and the second magnetic layer. The magnetic memory element is characterized in that: magnetic domains having mutually-antiparallel magnetization and a domain wall for separating the magnetic domains are constantly formed in at least one of the magnetic layers; and positions of the adjoining magnetic domains are controlled by moving the domain wall in the magnetic layer to carry out information recording. The second magnetic layer may have the magnetic anisotropy in a direction perpendicular to a film surface.

As described above, in the MRAM using the current driven domain wall motion, it is concerned that an absolute value of the writing current becomes relatively large. Accordingly, as described below, the inventors have studied that the writing current can be reduced in the MRAM using the current driven domain wall motion by using the perpendicular magnetic anisotropy material as the magnetization recording layer.

Figure 3A:
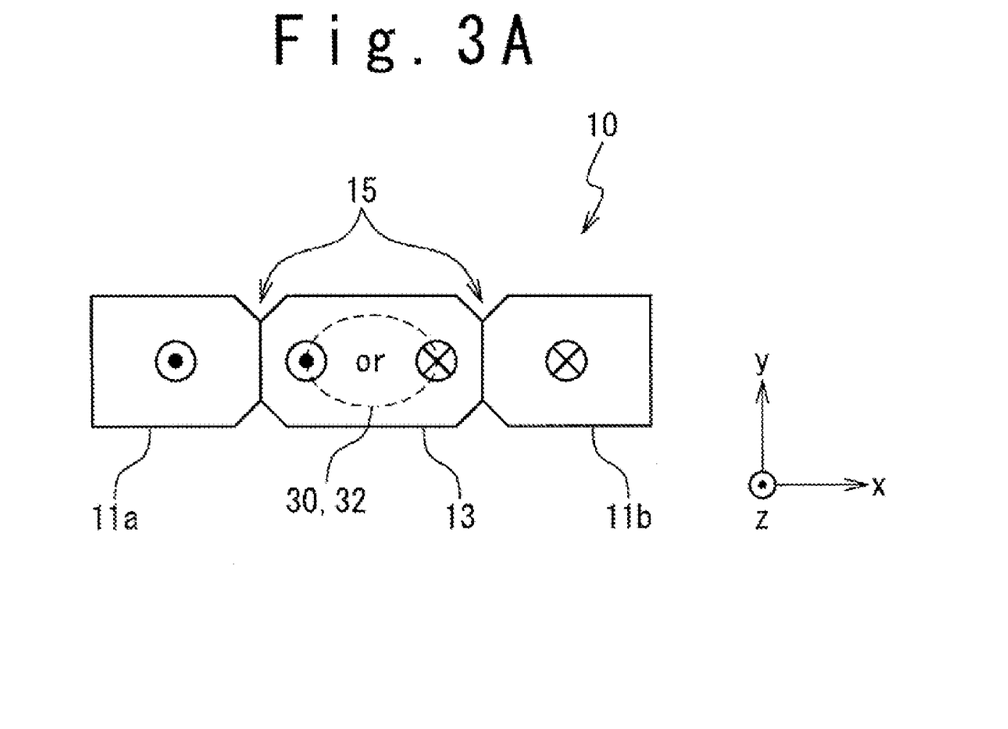
FIG. 3A is a plane view of a conceivable magnetoresistive element using perpendicular magnetic anisotropy material.
Figure 3B:
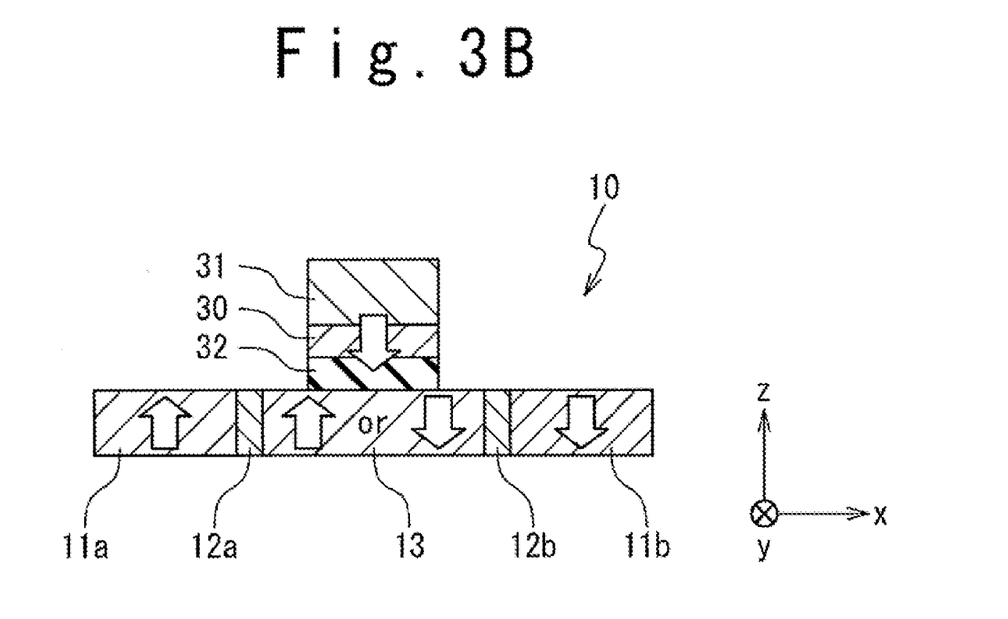
FIG. 3B is a cross-sectional view of the conceivable magnetoresistive element using the perpendicular magnetic anisotropy material.

FIGS. 3A and 3B are a plane view and a cross-sectional view of a conceivable magnetoresistive element using a perpendicular magnetic anisotropy material, respectively. A magnetization recording layer 10 includes a magnetization switching area 13 and a pair of magnetization pinned areas 11a and 11b. However, in FIGS. 3A and 3B, a symbol represented by a white circle and a dot, a symbol represented by a white circle and an X-mark, and a white arrow show magnetization directions of the magnetization switching area 13 and the magnetization pinned area 11a and 11b in which they are described.

The magnetization switching area 13 overlaps with a tunnel insulating layer 32 and a pinned layer 30, and has a function as a free layer. The magnetization pinned area 11a is adjacent to one end of the magnetization switching area 13 and the magnetization pinned area 11b is adjacent to the other end of the magnetization switching area 13. Constriction portions 15 are provided to joint portions between the magnetization switching area 13 and the magnetization pinned areas 11a or 11b. Mutually-opposite pinned magnetizations are applied to the pair of the magnetization pinned areas 11a and 11b. In addition, the constriction portions 15 serve as pinned potentials to the domain wall, and the domain wall is initialized so as to be positioned to a region 12a or a region 12b in the vicinity of the constriction portion. The data reading is carried out by using variations of the tunnel resistance depending on the relative directions of magnetizations of the magnetization switching area 13 and the pinned layer 30. Since the magnetization of the magnetization switching area 13 is in a direction perpendicular to the film surface, the magnetization of the pinned layer 30 also has to be perpendicular to the film surface (for example, in Japanese Patent Publication No. 2003-110094A1 and Japanese Patent Publication No. 2006-73930A1).

Meanwhile, regarding the storing and reading of information, it is generally desirable that an MR ratio is large as much as possible. In the past, many reports about a configuration as the magnetic tunnel junction where both of the free layer and the pinned layer have magnetization components in the surfaces are issued. For example, in a case where CoFeB is used for the free layer and the pinned layer and MgO is used for the tunnel barrier, the MR ratio of more than 200% was observed (refer to "230% room-temperature magnetoresistance in CoFeB/MgO/CoFeB magnetic tunnel junctions", D. D. Djayaprawira et al., Applied Physics Letters, Vol. 86, 092502 (2005)). However, in the magnetic tunnel junction where the conceivable magnetic layer having the perpendicular anisotropy is used as shown in FIGS. 3A and 3B, such a large MR ratio has not been observed. Hence, there is a problem whether or not the storing and reading of information can be adequately carried out.

DISCLOSURE OF THE INVENTION

An object of the present invention is to provide a magnetic random access memory having a structure able to adequately carry out the storing and reading of information in a current driven domain wall motion MRAM in which magnetic anisotropy of a magnetic recording layer is in a perpendicular direction.

A magnetic random access memory of the present invention includes: a magnetization recording layer including a ferromagnetic layer and having perpendicular magnetic anisotropy; and a magnetic reading layer provided on the magnetic recording layer and used for reading information. The magnetization recording layer includes: a magnetization switching area having reversible magnetization; a first magnetization pinned area connected to a first boundary of the magnetization switching area and having magnetization whose direction is pinned in a first direction; and a second magnetization pinned area connected to a second boundary of the magnetization switching area and having magnetization whose direction is pinned in a second direction. The magnetic reading layer includes: a magnetic sensing layer whose direction of magnetization changes based on a direction of the magnetization of the magnetization switching area; a nonmagnetic barrier layer provided on the magnetic sensing layer; and a pinned layer provided on the nonmagnetic barrier layer.

BRIEF DESCRIPTION OF THE DRAWINGS

The above and other objects and features of the present invention will be more apparent from the following description of certain preferred exemplary embodiments taken in conjunction with the accompanying drawings, in which.

BEST MODE FOR CARRYING OUT THE INVENTION

Referring to attached drawings, an MRAM according to an exemplary embodiment of the present invention will be explained below. The MRAM according to the present exemplary embodiment is a domain wall motion MRAM using a magnetic layer having perpendicular magnetic anisotropy.

1. Configuration of Magnetic Memory Cell

Figure 4A:
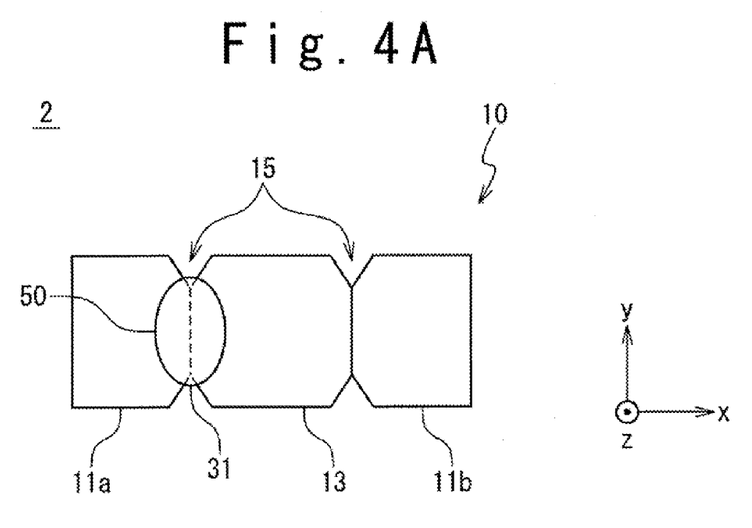
FIG. 4A is a plane view showing one example of a configuration of a magnetoresistive element according to the exemplary embodiment.
Figure 4B:
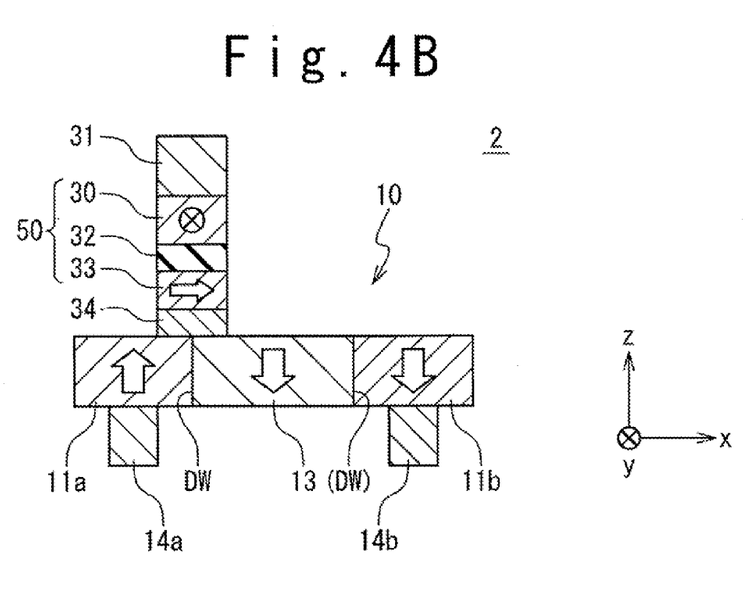
FIG. 4B is a cross-sectional view showing one example of the configuration of the magnetoresistive element according to the exemplary embodiment.
Figure 4C:
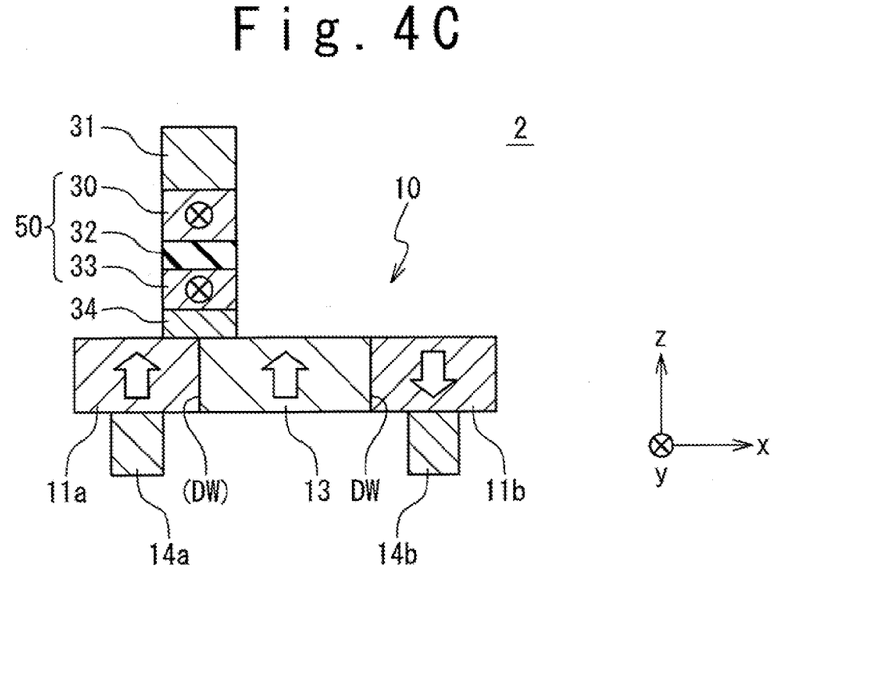
FIG. 4C is a cross-sectional view showing one example of the configuration of the magnetoresistive element according to the exemplary embodiment.

FIG. 4A is a plane view showing one example of a configuration of a magnetoresistive element according to the present exemplary embodiment. FIGS. 4B and 4C are cross-sectional views, each showing one example of the configuration of the magnetoresistive element according to the present exemplary embodiment. An example of using the magnetoresistive element 2 as a magnetic memory cell will be explained. FIG. 4B shows, for example, a case where "1" is stored. FIG. 4C shows, for example, a case where "0" is stored. Meanwhile, in FIGS. 4B and 4C, a symbol represented by a white circle and an X-mark and a white arrow show magnetization directions in the respective layers (these are the same in below). The magnetoresistive element 2 includes a magnetic recording layer 10 and a magnetic reading layer 50 that are ferromagnetic substance layers. A separation layer 34 is arranged between the magnetic recording layer 10 and the magnetic reading layer 50. Current terminals 14a and 14b are provided to both ends of the magnetic recording layer 10. A wiring 31 for deriving current is connected to the magnetic reading layer 50.

The magnetic recording layer 10 has anisotropy in a direction perpendicular to a substrate surface (an XY plane). As the material, it is preferable to include at least one of materials selected from among Fe, Co, and Ni. Moreover, the perpendicular magnetic anisotropy can be stabilized by including Pt or Pd. In addition to this, the magnetic recording layer can be adjusted to realize a desired magnetic characteristic by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, and Sm. Specifically, Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, and the like are exemplified. Other than this, the magnetic anisotropy in the perpendicular direction also can be realized when the layer including at least one material selected from among Fe, Co, and Ni is stacked on a different layer. Specifically, stacked films of Co/Pd, Co/Pt, Fe/Au, and the like are exemplified.

As shown in FIGS. 4A, 4B, and 4C, the magnetic recording layer 10 according to the present exemplary embodiment includes a first magnetization pinned area 11a, a second magnetization pinned area 11b, and the magnetization switching area 13. In the present exemplary embodiment, constriction portions 15 are formed in a boundary between the magnetization switching area 13 and the first magnetization pinned area 11a and a boundary between the magnetization switching area 13 and the second magnetization pinned area, respectively. The constriction portions 15 serve as pinned potentials with respect to a domain wall DW. If each boundary is under a condition to minimize the pinned potential, a shape and a magnetic characteristic in the vicinity of the boundary between the magnetization switching area 13 and each of the magnetization pinned areas 11a or 11b are not limited to the constriction.

The magnetizations of the first magnetization pinned area 11a and the second magnetization pinned area 11b are pinned in mutually-antiparallel directions. Meanwhile, "magnetization is pinned" means that a direction of the magnetization after the writing operation does not change in comparison with a direction of the magnetization before the writing operation. That is, even if a direction of a partial magnetization in the magnetization pinned area changes, the direction returns to the original direction after the writing operation, and consequently the direction of the magnetization after the writing operation does not change in comparison with the direction of the magnetization before the writing operation.

Meanwhile, the direction of magnetization of the magnetization switching area 13 can be switched, and is in a +Z direction or in a −Z direction. As shown in FIG. 4B, in a case where the direction of magnetization of the magnetization switching area 13 is in the −Z direction, the first magnetization pinned area 11a forms one magnetic domain, and the magnetization switching area 13 and the second magnetization pinned area 11b form another magnetic domain. That is, the domain wall DW is formed between the first magnetization pinned area 11a and the magnetization switching area 13. Meanwhile, as shown in FIG. 4C, in a case where the direction of magnetization of the magnetization switching area 13 is in the +Z direction, the first magnetization pinned area 11a and the magnetization switching area 13 form one magnetic domain and the second magnetization pinned area 11b forms another magnetic domain. That is, the magnetic domain DW is formed between the second magnetization pinned area 11b and the magnetization switching area 13.

As shown in FIG. 4B and FIG. 4C, the magnetic reading layer 50 according to the present exemplary embodiment includes a magnetic sensing layer 33, a tunnel barrier layer 32, and a pinned layer 30, and forms a magnetic tunnel junction. Both the magnetic sensing layer 33 and the pinned layer 30 are magnetic films having the in-plane magnetic anisotropy in the surfaces of the respective layers. That is, the directions of the magnetic anisotropy of the layers are substantially perpendicular to the direction of the magnetic anisotropy of the magnetic recording layer 10. As the magnetic sensing layer 33 and the pinned layer 30, it is desired that at least one of materials selected from Fe, Co, and Ni is included. Specifically, NiFe, CoFe, CoFeB, and the like can be exemplified. The direction of magnetization of the pinned layer 30 does not change in any one of a writing operation and a reading operation. For this reason, it is desired for the magnetic anisotropy of the pinned layer 30 to be larger than that of the magnetic sensing layer 33. This is realized by employing the material and/or composition of the magnetization recording layer 10 different from those of the pinned layer 30. In addition, the anisotropy can be realized by stacking an antiferromagnetic layer (not shown in the drawing) such as PtMn, IrMn, FeMn, and the like on a surface opposite to the tunnel barrier layer 33 of the pinned layer 30 to pin the magnetization. Moreover, the pinned layer 30 can be realized by a stacked film including a ferromagnetic layer, a nonmagnetic layer, and a ferromagnetic layer. Here, as the nonmagnetic layer, Ru, Cu, or the like can be used, and the magnetization of the two ferromagnetic layers are antiparallel with each other. When the magnetization of the two ferromagnetic layers is equal, leaking magnetic field from the pinned layer can be suppressed. As the tunnel barrier layer 32, a thin insulating film such as an $Al_2O_3$ film, an MgO or the like can be used.

A relative position between the magnetic reading layer 50 and the magnetic recording layer 10 is arranged so that the direction of magnetization of the magnetic sensing layer 33 can change depending on the domain wall DW of the magnetic recording layer 10 and a magnetic flux from the magnetic domain. In addition, the direction of the magnetic anisotropy of the magnetic sensing layer 33 and the direction of the magnetic anisotropy of, the pinned layer 30 have to be defined so that a tunnel resistance in a "0" state can be different from a tunnel resistance in a "1" state. In FIGS. 4A and 4B, the magnetic reading layer 50 is arranged in the vicinity of a boundary between the first magnetization pinned area 11a and the magnetization switching area 13 of the magnetization recording layer 10. A magnetization easy axis of the magnetization sensing layer 33 and a magnetization easy axis of the pinned layer 30 are given in a direction perpendicular to the direction of motion of the magnetic domain DW of the magnetic recording layer 10. As origin of the magnetic anisotropy of the magnetic sensing layer 33, crystal magnetic anisotropy, stress-induced anisotropy, or the like can be used in addition to the shape anisotropy (an elliptical shape) as shown in FIG. 4A. On this occasion, the separation layer 34 between the magnetic recording layer 10 and the magnetic reading layer 50 can at least partially employ the antiferromagnetic layer such as PtMn, IrMn, FeMn, or the like. In this manner, it can be tried to stabilize the magnetic domain of the magnetic sensing layer 33.

In this manner, when a position of the domain wall DW in the magnetic recording layer 10 is changed, data is written to the magnetoresistive element (the magnetic memory cell) of the present invention. On this occasion, a state of the magnetic reading layer 50 is also changed based on a state of the magnetic recording layer 10. The data is read by detecting the state of the magnetic reading layer 50 reflecting the state of the magnetic recording layer 10.

Figure 5:
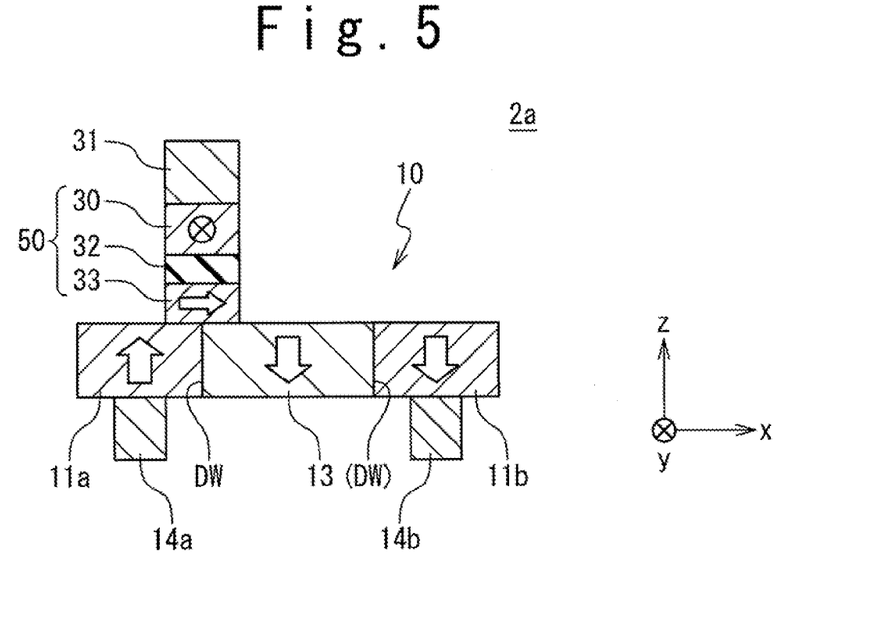
FIG. 5 is a cross-sectional view showing a modified example of a configuration of a magnetoresistive element according to the exemplary embodiment.

FIG. 5 is a cross-sectional view showing a modified example of a configuration of a magnetoresistive element according to the present exemplary embodiment. The magnetoresistive element 2a omits the separation layer 34, and directly forms the magnetic reading layer 50 on the magnetic recording layer 10. Thus, in the magnetoresistive element 2a, the writing current is not separated to the separation layer 39. Accordingly, the writing current can be reduced.

Figure 6:
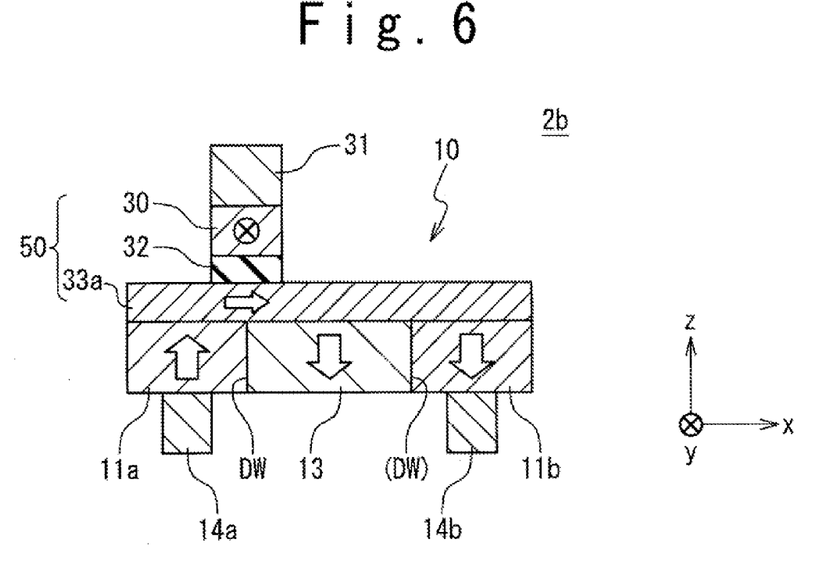
FIG. 6 is a cross-sectional view showing another modified example of a configuration of a magnetoresistive element according to the exemplary embodiment.

FIG. 6 is a cross-sectional view showing another modified example of a configuration of a magnetoresistive element according to the present exemplary embodiment. In the magnetoresistive element 2b, a magnetic sensing layer 33a is fabricated simultaneously with the magnetic recording layer 10. Thus, a shape of the magnetic sensing layer 33a also can be substantially equal to a shape of the magnetic recording layer 10. In this case, in fabrication (forming) of the magnetic reading layer 50 above the barrier layer 32, the fabrication can be stopped at the barrier layer 32 (serving as an etching stopper). Accordingly, the forming of the magnetic reading layer 50 by the etching can be realized at a high yield.

Figure 7:
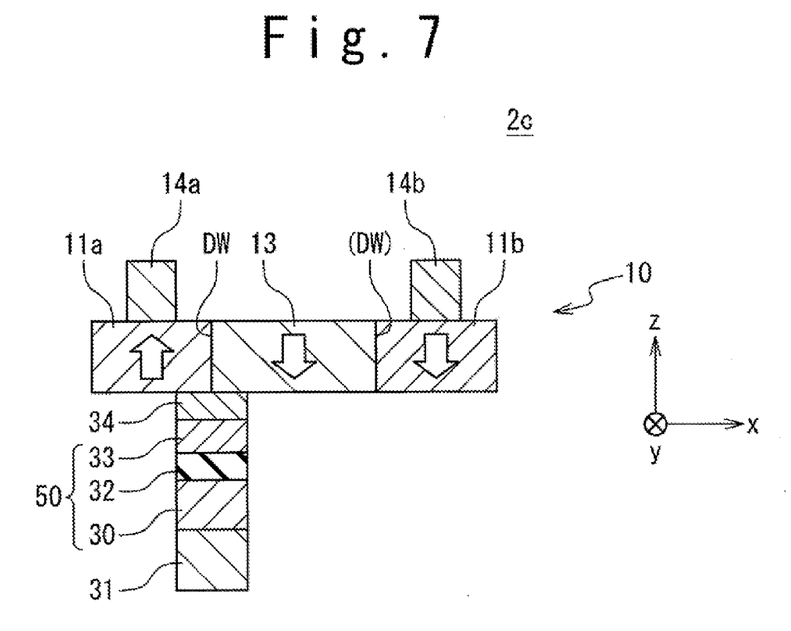
FIG. 7 is a cross-sectional view showing still another modified example of a configuration of a magnetoresistive element according to the exemplary embodiment.

FIG. 7 is a cross-sectional view showing still another modified example of a configuration of a magnetoresistive element according to the present exemplary embodiment. In the magnetoresistive element 2c, a positional relationship between the magnetic recording layer 10 and the magnetic reading layer 50 is turned upside down in comparison with those in FIGS. 4B and 4C. In this modified example, the film formation and fabrication (forming) of the magnetic recording layer 10 are carried out after: the magnetic reading layer 50 is fabricated (formed); an interlayer insulating layer is formed; and a planarization process by the CMP is carried out.

Figure 8:
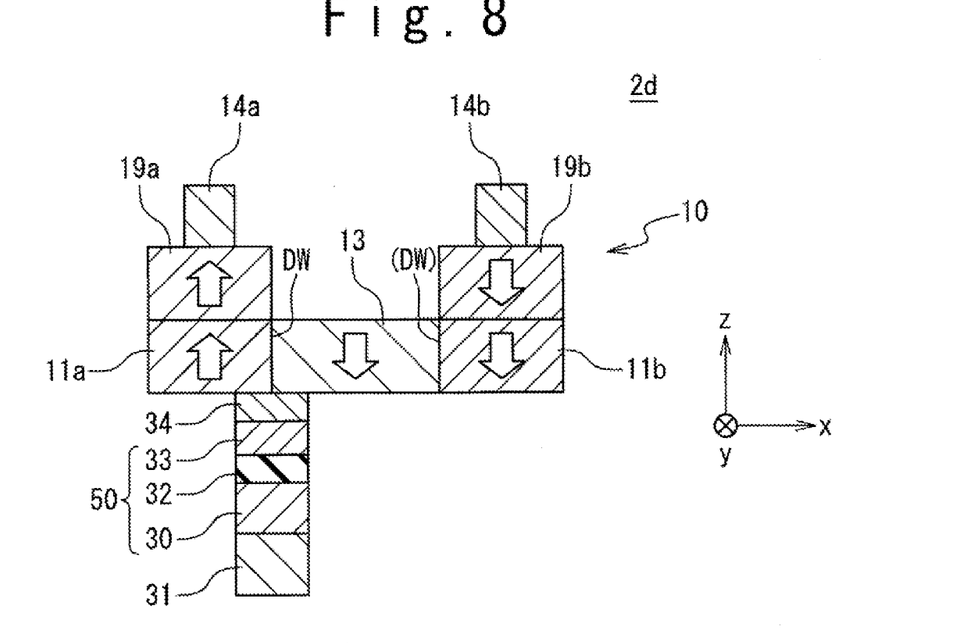
FIG. 8 is a cross-sectional view showing still another modified example of a configuration of a magnetoresistive element according to the exemplary embodiment.

FIG. 8 is a cross-sectional view showing still another modified example of a configuration of a magnetoresistive element according to the present exemplary embodiment. The magnetoresistive element 2d is an example including a first magnetization pinning magnetic layer 19a overlapping with the first magnetization pinned area 11a and a second magnetization pinning magnetic layer 19b overlapping with the second magnetization pinned area 11b in the magnetic recording layer 10. The magnetization pinning magnetic layers 19a and 19b play roles in pinning the magnetizations of the magnetization pinned areas 11a and 11b respectively, and serve as spin-polarized current sources respectively. When magnetic coercive forces of the first magnetization pinning magnetic layer 19a and the second magnetization pinning magnetic layer 19b are changed, the magnetization of the magnetization pinned area 11a and the magnetization pinned area 11b can be antiparallel with each other by using the hysteresis.

Figure 9:
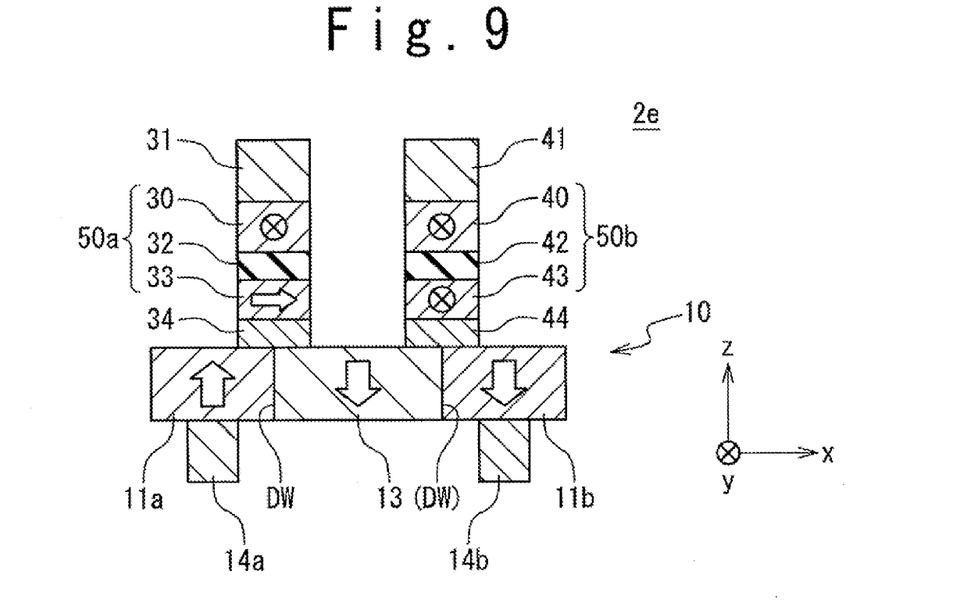
FIG. 9 is a cross-sectional view showing still another modified example of a configuration of a magnetoresistive element according to the exemplary embodiment.

FIG. 9 is a cross-sectional view showing still another modified example of a configuration of a magnetoresistive element according to the present exemplary embodiment. The magnetoresistive element 2e includes two magnetic reading layers 50a and 50b. The magnetic reading layers 50a and 50b are provided on a boundary between the first magnetization pinned area 11a and the magnetization switching area 13 and on a boundary between the second magnetization pinned area 11b and the magnetization switching area 13, respectively. Since signals from the respective two magnetic reading layers 50a and 50b are different depending on existence of the domain wall DW in the reading operation, a signal quality of the reading signal can be improved by obtaining a differential output between the both signals.

2. Writing Operation

Next, a principal for writing data to the magnetoresistive element (the magnetic memory cell) will be explained. Meanwhile, writing principals of other magnetoresistive elements 2a to 2e are the same.

Figure 10:
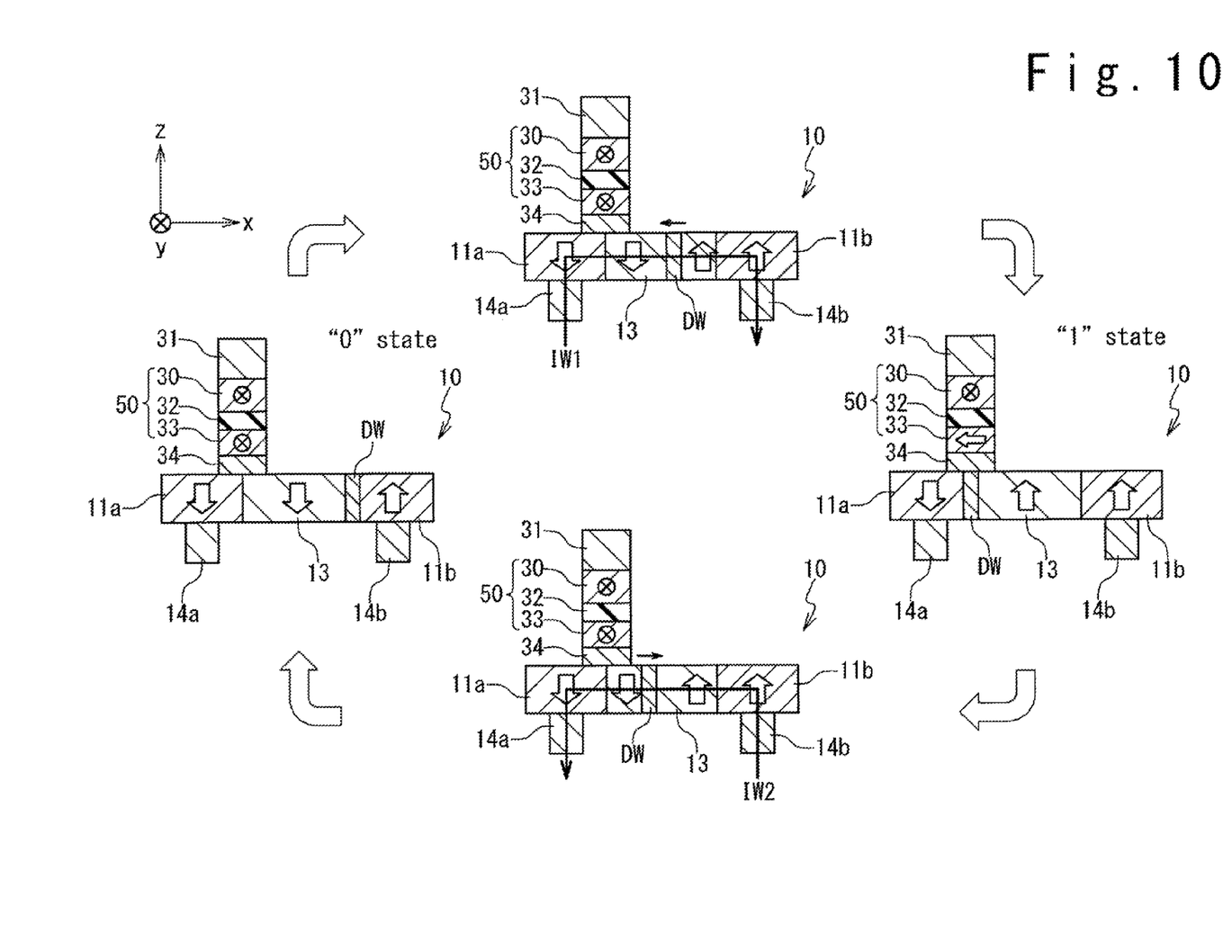
FIG. 10 is a cross-sectional view showing a principle of data writing to a magnetic memory cell (a magnetoresistive element) according to the exemplary embodiment.

FIG. 10 is a cross-sectional view showing a principal for writing data to the magnetoresistive element (the magnetic memory cell) according to the present exemplary embodiment. The data writing is carried out in the domain wall motion method using the spin transfer. A writing current Iw not flows in a direction of penetrating the MTJ but flows in the magnetic recording layer 10 in a planer manner. The writing current Iw is supplied from the above-mentioned current supply terminals 14a and 14b to the magnetic recording layer 10. As shown in a left-side view (the "0" state) in FIG. 10, in the state of data "0", the direction of magnetization of the magnetization switching area 13 is in the -Z direction. The domain wall DW exists on a boundary between the magnetization switching area 13 and the second magnetization pinned area 11b. Meanwhile, as shown in a right-side view (the "1" state) in FIG. 10, in the state of data "1", the direction of magnetization of the magnetization switching area 13 is in the +Z direction. The domain wall DW exists on a boundary between the magnetization switching area 13 and the first magnetization pinned area 11a.

In the writing operation of data "1", the first writing current Iw1 is supplied from the current supply terminal 14a, flows to the second magnetization pinned area 11b passing through the magnetization switching area 13 from the first magnetization pinned area 11a, and flows out through the current supply terminal 14b (a central-upper view in FIG. 10). In this case, spin electrons are injected from the second magnetization pinned area 11b to the magnetization switching area 13. The spin of the injected electrons drives the domain wall DW existing on the boundary between the magnetization switching area 13 and the second magnetization pinned area 11b in a direction to the first magnetization pinned area 11a. As the result, the direction of magnetization of the magnetization switching area 13 switches to the +Z direction. That is, the magnetization of the magnetization switching area 13 is switched because of a spin transfer effect, and the direction of the magnetization changes to the +Z direction. The domain wall DW moves to the boundary between the magnetization switching area 13 and the first magnetization pinned area 11a (a right-side view in FIG. 10). The magnetization of the first magnetization pinned area 11a is in the Z direction, and the magnetization of the magnetization switching area 13 is in the +Z direction. On this occasion, a magnetic field in the -X direction is applied to the magnetic sensing layer 33 toward the magnetization pinned area 11a from the magnetization switching area 13, and the magnetization of the magnetic sensing layer 33 faces to the -X direction.

On the other hand, in the writing operation of data "0", a second writing current Iw2 is supplied from the current supply terminal 14b, flows to the first magnetization pinned area 11a passing through the magnetization switching area 13 from the second magnetization pinned area 11b, and flows out through the current supply terminal 14a (a central-lower view in FIG. 10). In this case, spin electrons are injected from the first magnetization pinned area 11a to the magnetization switching area 13. The spin of the injected electrons drives the domain wall DW existing on the boundary between the magnetization switching area 13 and the first magnetization pinned area 11a in a direction to the second magnetization pinned area 11b. As the result, the direction of magnetization of the magnetization switching area 13 switches to the -Z direction. That is, the magnetization of the magnetization switching area 13 is switched because of the spin transfer effect, and the direction of the magnetization changes to the -Z direction. The domain wall DW moves to the boundary between the magnetization switching area 13 and the second magnetization pinned area 11b (a left-side view in FIG. 10). In the vicinity of the magnetic sensing layer 33, the domain wall DW does not exist in the magnetic recording layer 10, and the magnetization faces to the +Z direction. The magnetization of the pinned layer 30 is pinned in the +Y direction, and the magnetic anisotropy of the magnetic sensing layer 33 is also in the +Y direction. In this case, the magnetization of the magnetic sensing layer 33 faces to the +Y direction more depending on the shape magnetic anisotropy than the influence of the magnetization of the magnetic recording layer 10.

In this manner, the direction of magnetization of the magnetization switching area 13 switches depending on the writing currents Iw1 and Iw2 flowing in the magnetic recording layer 10 in a planer manner. The first magnetization pinned area 11a and the second magnetization pinned area 11b serve as supply sources of electrons having different spin.

In this case, the magnetic recording layer 10 is formed of the perpendicular magnetic anisotropy material. Thus, the magnetization direction of each area of the magnetic recording layer 10 is perpendicular to the writing currents Iw1 and Iw2. Accordingly, amounts of the writing currents Iw1 and Iw2 can be significantly reduced.

In addition, since the writing operation is carried out on the basis of a relationship between the magnetic field of the pinned layer 30, the magnetic anisotropy of the magnetic sensing layer 33, and the position of the domain wall of the magnetic recording layer 10, miswriting is hard to occur, and data can be written so as to be tough in the thermal disturbance.

3. Reading Operation

Next, a principal for reading data to the magnetoresistive element (the magnetic memory cell) will be explained. Meanwhile, reading principals of other magnetoresistive elements 2a to 2e are the same.

Figure 11A:
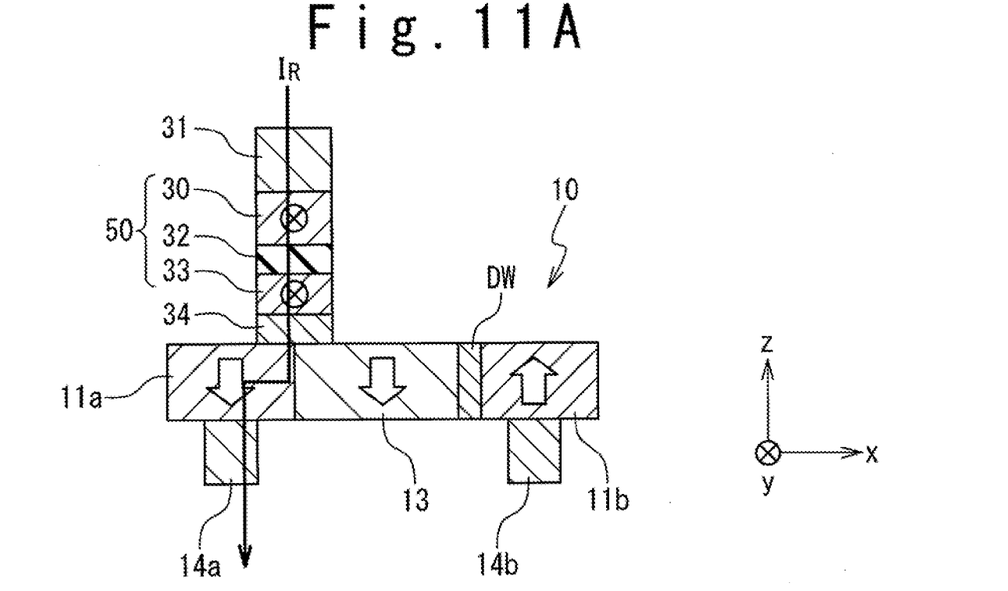
FIG. 11A is a cross-sectional view showing a principle of data reading to the magnetic memory cell (the magnetoresistive element) according to the exemplary embodiment.
Figure 11B:
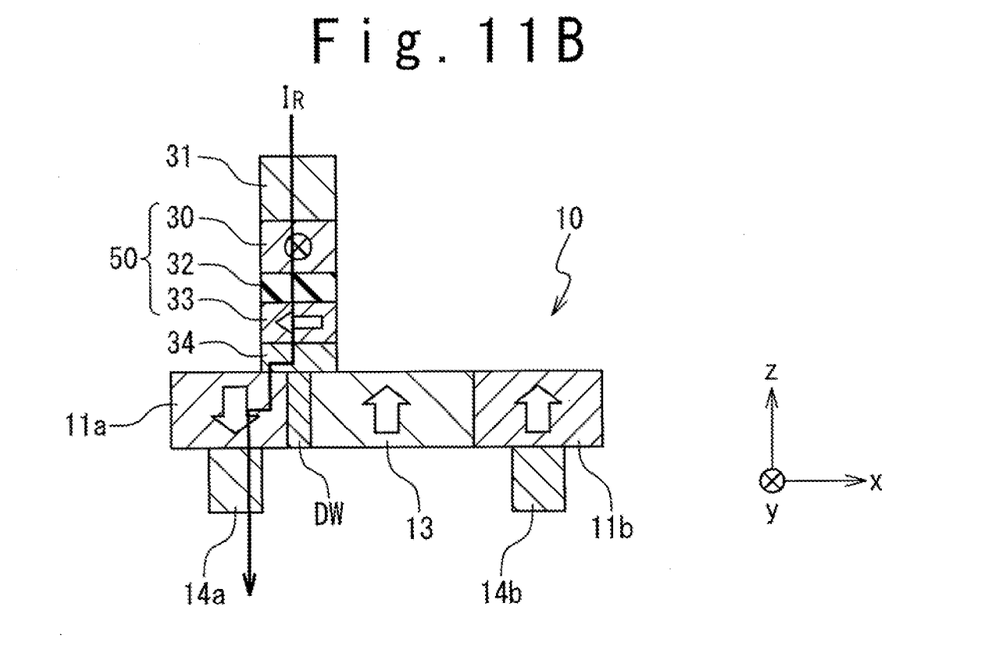
FIG. 11B is a cross-sectional view showing a principle of data reading from the magnetic memory cell (the magnetoresistive element) according to the exemplary embodiment.

FIGS. 11A and 11B are cross-sectional views showing a principal for reading data from the magnetoresistive element (the magnetic memory cell) according to the present exemplary embodiment. In the reading of data, a reading current $I_R$ is supplied to the magnetic reading layer 50. That is, the reading current $I_R$ flows from a wiring layer 31 to the current supply terminal 14a via the pinned layer 30, the barrier layer 20, the magnetic sensing layer 33, the separation layer 34, and the first magnetization pinned area 11a.

Referring to FIG. 11A, in a case where data "0" is stored (refer to a left-side view in FIG. 10), the magnetization of the pinned layer 30 is pinned in the +Y direction, The magnetic anisotropy of the magnetic sensing layer 33 is also in the +Y direction. In the state of data "0", in the vicinity of the magnetic sensing layer 33, the domain wall DW does not exist in the magnetic recording layer 10, and the magnetization faces to the −Z direction. On this occasion, the magnetic field applied to the magnetic sensing layer 33 is also in the −Z direction. Since being hard to face to the ±Z directions because of the diamagnetic field, the magnetization of the magnetic sensing layer 33 faces to a direction of the magnetization easy axis with little change of the direction by the magnetic field of the magnetic recording layer 10. On this occasion, directions of the magnetizations of the magnetic sensing layer 33 and the pinned layer 30 becomes parallel, and the tunnel resistance of the magnetic reading layer 50 becomes a low resistance state. Data "0" can be read by detecting the low resistance.

Referring to FIG. 11, in a state where data "1" is stored (refer to a right-side view in FIG. 10), in the vicinity of the magnetic sensing layer 33, the domain wall DW is formed in the magnetic recording layer 10. That is, the magnetization of the first magnetization pinned area 11a is in the −Z direction, and the magnetization of the magnetization switching area 13 is in the +Z direction. On this occasion, a magnetic field in the −X direction is applied to the magnetic sensing layer 33 toward the magnetization pinned area 11a from the magnetization switching area 13, and the magnetization of the magnetic sensing layer 33 faces to the −X direction. Then, a relative angle formed by the magnetizations of the magnetic sensing layer 33 and the pinned layer 30 becomes approximately 90 degrees, and the resistance of the magnetic reading layer 50 becomes a middle resistance state. Here, the middle resistance state means that a resistance change is approximately half of the maximum resistance change of the magnetic reading layer 50. Data "1" can be read by detecting the middle resistance.

As describe above, in the magnetic resistance element in the present exemplary embodiment, data can be stored by using two states, a low resistance state same as a normal MRAM and a middle resistance state that is approximately half of a maximum resistance state of the normal MRAM. In this manner, the MR ratio can be set to be sufficiently large and to be substantially that of the normal MRAM in comparison with the cases of FIGS. 3A and 3B. Accordingly, magnitude of the reading current can be ensured to be sufficiently large due to the MR ratio.

Figure 12A:
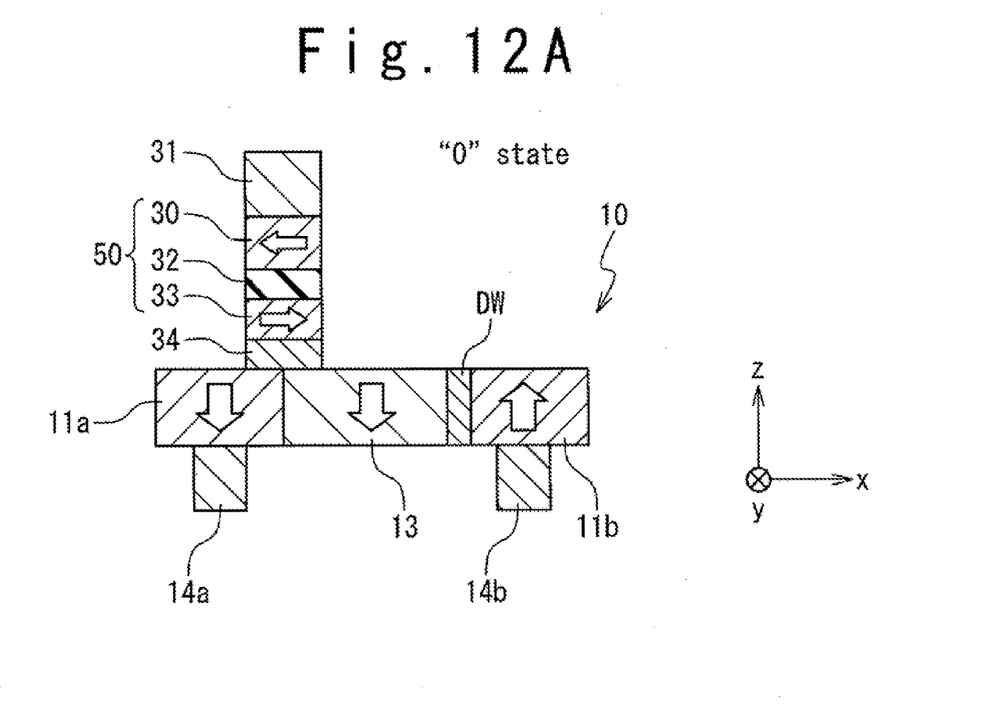
FIG. 12A is a cross-sectional view showing another configuration of a magnetoresistive element (a magnetic memory cell) according to the exemplary embodiment.
Figure 12B:
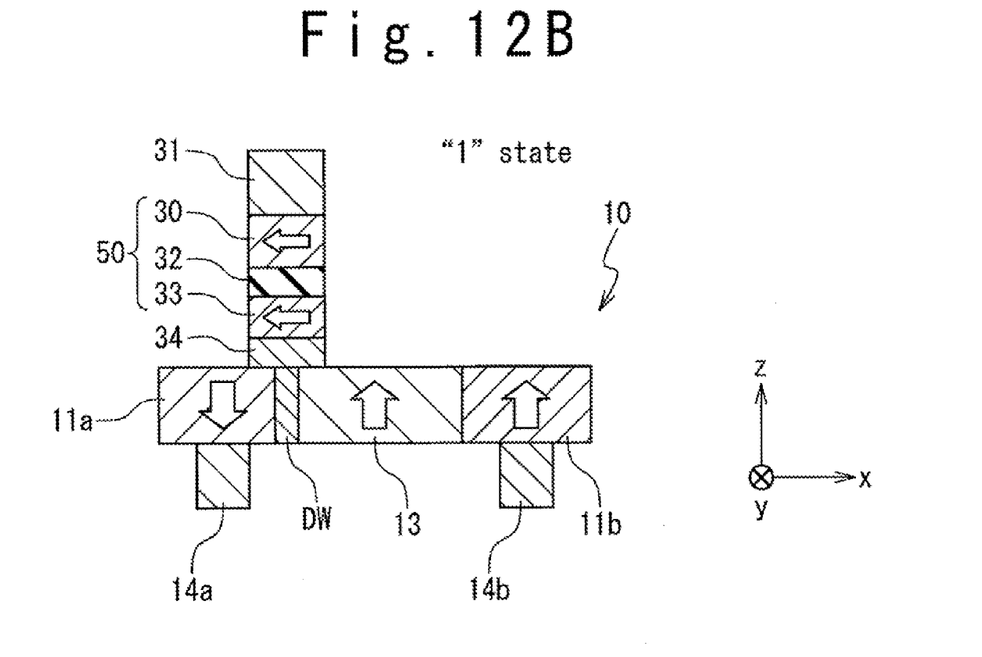
FIG. 12B is a cross-sectional view showing another configuration of a magnetoresistive element (a magnetic memory cell) according to the exemplary embodiment.

The directions of the magnetic anisotropy of the magnetic sensing layer 33 and the pinned layer 30 may be directions other than the directions shown in FIGS. 10, 11A, and 11B. FIGS. 12A and 123 are cross-sectional views showing another structure of the magnetoresistive element (the magnetic memory cell) according to the present exemplary embodiment. FIG. 12A shows the "0" state in the case where the magnetization pinned direction of the pinned layer 30 is in the −X direction and the magnetization anisotropy of the magnetic sensing layer 33 is in the +X direction. FIG. 12B shows the "1" state in the case where the magnetization pinned direction of the pinned layer 30 is in the −X direction and the magnetization anisotropy of the magnetic sensing layer 33 is in the −X direction. Here, a bias magnetic field is applied in the +X direction to the magnetic sensing layer 33, and when a magnetic field from the vicinity of the domain wall DW of the magnetic recording layer 10 does not exist, the magnetization is considered to face to the +X direction. A leaking magnetic field from an end surface of the pinned layer 30 may be used as the bias magnetic field, and a magnetic layer for applying the bias magnetic field may be additionally provided in the magnetic reading layer 50. In FIGS. 12A and 12B, "0" state corresponds to a high resistance state and "1" state corresponds to the low resistance state, and a feature that the maximum resistance change can be used as a reading signal is shown.

In the magnetoresistive element of this case, data can be stored by using two states, which are a low resistance state same as the normal MRAM and a maximum resistance state of the normal MRAM. In this manner, the MR ratio can be set to be sufficiently large and to be substantially that of the normal MRAM in comparison with the cases of FIGS. 3A and 3B. Accordingly, magnitude of the reading current can be ensured to be sufficiently large due to the MR ratio.

4. Configuration of MRAM

Figure 13:
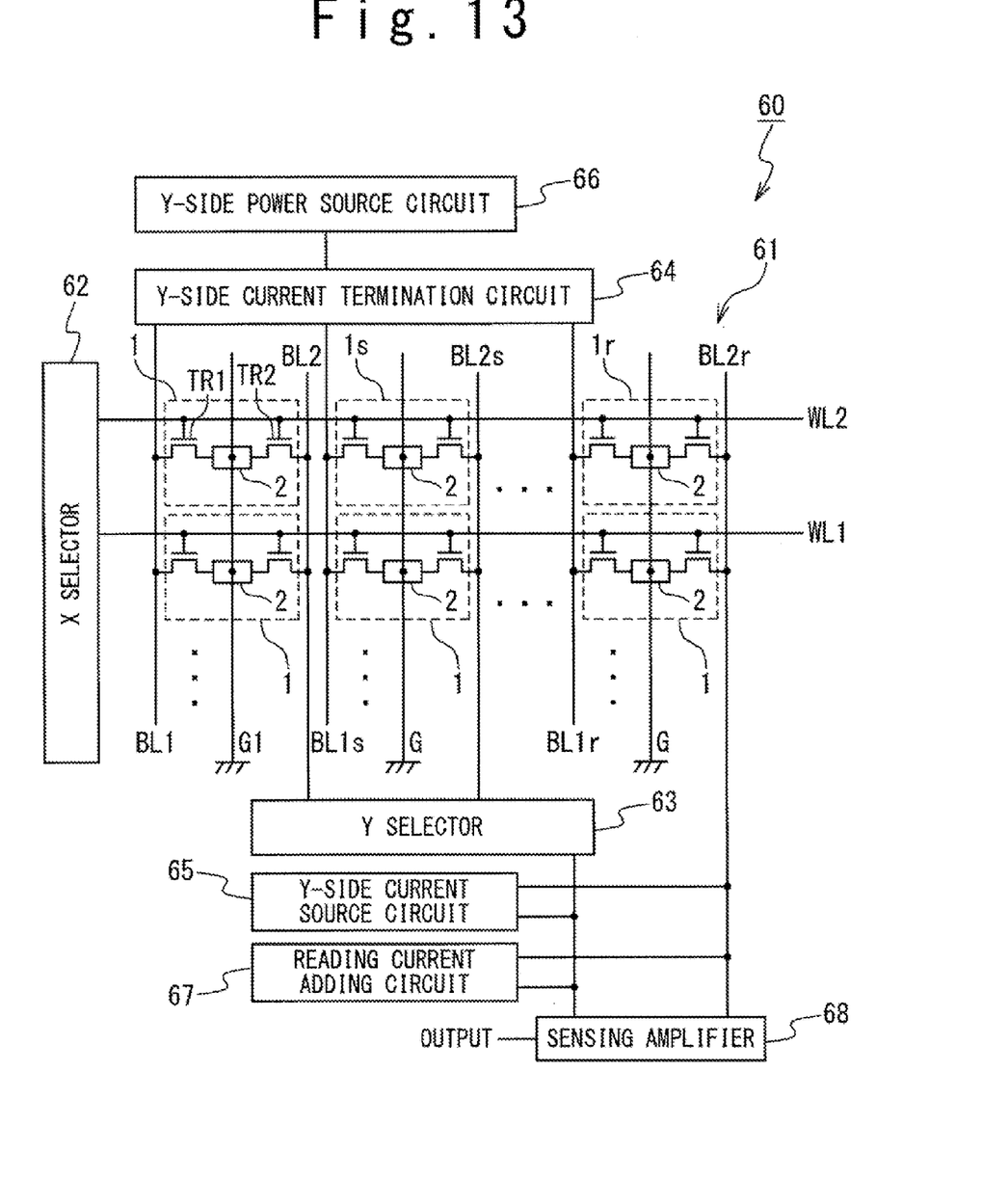
FIG. 13 is a block diagram showing one example of a configuration of an MRAM according to the exemplary embodiment.

FIG. 13 is a block diagram showing one example of a configuration of a MRAM according to the present exemplary embodiment. In FIG. 13, a MRAM 60 includes a memory cell array 61 where a plurality of magnetic memory cells 1 is arranged in a matrix state. The memory cell array 61 includes reference cells 1r referenced in the data reading together with the magnetic memory cells 1 used for data recording. A structure of the reference cell 1r is the same as that of the magnetic memory cell 1.

Each of the magnetic memory cells 1 includes selection transistors TR1 and TR2 in addition to the magnetoresistive elements 2 (including 2a to 2e) shown in FIGS. 4A to 12B. One of a source and a drain of the selection transistor TR1 is connected to the current supply terminal 14a of the first magnetization pinned area 11a, and the other is connected to a first bit line BL1. One of a source and a drain of the selection transistor TR2 is connected to the current supply terminal 14b of the second magnetization pinned area 11b, and the other is connected to a second bit line BL2. The gates of the selection transistors TR1 and TR2 are connected to a word line WL. The pinned layer 30 of the magnetic memory cell 1 is connected to a ground line G via the wiring 31 for deriving current as shown in the drawing.

The word line WL is connected to an X selector 62. The X selector 62 selects the word line WL connected to a target memory cell is as a selection word line WLs in the data writing and the reading operation. A first bit line BL1 is connected to a Y-side current termination circuit 64, and a second bit line BL2 is connected to a Y selector 63. The Y selector 63 selects a second bit line BL2 connected to the target memory cell is as a selected second bit line BL2s. The Y-side current termination circuit 64 selects a first bit line BL1 connected to the target memory cell is as a selected first bit line BL1s.

In the data writing operation, a Y-side current source circuit 65 supplies or derives predetermined writing currents (Iw1 and Iw2) to or from the selected second bit line BL2s. In the data writing operation, a Y-side power source circuit 66 supplies a predetermined voltage to the Y-side current termination circuit 64. As the result, the writing currents (Iw1 and Iw2) flow into a Y selector 63 or flow out from the Y selector 63. The X selector 62, the Y selector 63, the Y-side current termination circuit 64, the Y-side current source circuit 65, and Y-side power source circuit 66 constitute a "writing current supply circuit" for supplying the writing currents Iw1 and Iw2 to the magnetic memory cell 1.

In the data reading operation, the first bit line BL1 is set to "Open". A reading current adding circuit 67 supplies a predetermined reading current to the selected second bit line BL2s. In addition, the reading current adding circuit 67 supplies a predetermined current to the referenced second bit line BL2r connected to a reference cell 1r. A sensing amplifier 68 reads data from the target memory cell is on the basis of a difference between an electric potential of the referenced second bit line BL2r and an electric potential of the selected second bit line BL2s, and outputs the data.

In the present invention, the magnetic reading layer includes the magnetic tunnel junction separately from the magnetic recording layer. When the state of the magnetic recording layer is changed by the writing operation, the magnetic reading layer is affected by the change since being provided in the vicinity of the magnetic recording layer. As the result, the state of the magnetic tunnel junction of the magnetic reading layer also changes. Accordingly, data can be read by detecting a state of the magnetic tunnel junction. In this case, the magnitude of the writing current is dependent on whether or not the magnetic recording layer has the perpendicular magnetic anisotropy. In the present invention, since the magnetic recording layer has the perpendicular magnetic anisotropy, the magnitude of the writing current can be significantly reduced. Meanwhile, a magnitude of an output signal is dependent on the MR ratio of the magnetic tunnel junction. The present invention does not have to be configured so that the magnetic tunnel junction has the perpendicular magnetic anisotropy. For this reason, since the magnetic tunnel junction can be a magnetic tunnel junction having the large MR ratio, the magnitude of the output signal can be large. Accordingly, in the present invention, in the current-driven domain wall motion MRAM in which the magnetic anisotropy of the magnetic recording layer is in a perpendicular direction, the magnitude of the signal output can be large, and the storing and reading of information can be adequately carried out.

While the invention has been particularly shown and described with reference to exemplary embodiments thereof, the invention is not limited to these exemplary embodiments. It will be understood by those of ordinary skill in the art that various changes in form and details may be made therein without departing from the spirit and scope of the present invention as defined by the claims.

This application is the National Phase of PCT/JP2008/062277, filed Jul. 7, 2008, which is based upon and claims the benefit of priority from Japanese patent application No. 2007-202943 filed on Aug. 3, 2007, the disclosure of which is incorporated herein in its entirety by reference.

The invention claimed is:

1. A magnetic random access memory comprising:
   a magnetic recording layer configured to include a ferromagnetic layer and have perpendicular magnetic anisotropy; and
   a magnetic reading layer configured to be provided on said magnetic recording layer and be used for reading information;
   wherein said magnetic recording layer includes:
   a magnetization switching area configured to have reversible magnetization,
   a first magnetization pinned area configured to be connected to a first boundary of said magnetization switching area and have magnetization whose direction is pinned in a first direction, and
   a second magnetization pinned area configured to be connected to a second boundary of said magnetization switching area and have magnetization whose direction is pinned in a second direction,
   wherein said magnetic reading layer includes:
   a magnetic sensing layer whose direction of magnetization changes based on a direction of said magnetization of said magnetization switching area,
   a nonmagnetic barrier layer configured to be provided on said magnetic sensing layer, and
   a pinned layer configured to be provided on said nonmagnetic barrier layer.

2. The magnetic random access memory according to claim 1, wherein said magnetic sensing layer has in-plane magnetic anisotropy.

3. The magnetic random access memory according to claim 1, wherein said magnetic reading layer is provided at one of vicinity of said first boundary, vicinity of said second boundary, and both of vicinity of said first boundary and vicinity of said second boundary.

4. The magnetic random access memory according to claim 1, wherein a direction of pinned magnetization of said pinned layer is in-plane, and is perpendicular to a direction of a writing current applied to said magnetic recording layer.

5. The magnetic random access memory according to claim 1, wherein a direction of pinned magnetization of said pinned layer is in-plane, and is parallel to a direction of a writing current applied to said magnetic recording layer.

6. The magnetic random access memory according to claim 5, wherein a direction of magnetization anisotropy of said magnetic sensing layer is in-plane, and is parallel or perpendicular to a direction of a writing current applied to said magnetic recording layer.

7. The magnetic random access memory according to claim 6, wherein a bias magnetic field is applied to said magnetic sensing layer.

8. The magnetic random access memory according to claim 1, further comprising:
   a non-ferromagnetic metal configured to be provided between said magnetic recording layer and said magnetic reading layer.

9. The magnetic random access memory according to claim 1, wherein said magnetic recording layer and said magnetic sensing layer are directly contacted.

10. The magnetic random access memory according to claim 1, wherein said magnetic recording layer further includes:

a first magnetization pinning magnetic layer configured to be provided to contact said first magnetization pinned area and a direction of magnetization thereof is pinned in a first direction, and a second magnetization pinning magnetic layer configured to be provided to contact said second magnetization pinned area and a direction of magnetization thereof is pinned in a second direction.

11. The magnetic random access memory according to claim 1, wherein said magnetic recording layer has constriction portions provided at said first boundary and said second boundary.

12. The magnetic random access memory according to claim 2, wherein said magnetic reading layer is provided at one of vicinity of said first boundary, vicinity of said second boundary, and both of vicinity of said first boundary and vicinity of said second boundary.

13. The magnetic random access memory according to claim 12, wherein a direction of pinned magnetization of said pinned layer is in-plane, and is perpendicular to a direction of a writing current applied to said magnetic recording layer.

14. The magnetic random access memory according to claim 12, wherein a direction of pinned magnetization of said pinned layer is in-plane, and is parallel to a direction of a writing current applied to said magnetic recording layer.

15. The magnetic random access memory according to claim 12, wherein said magnetic recording layer has constriction portions provided at said first boundary and said second boundary.

* * * * *